United States Patent
Kuo et al.

(10) Patent No.: US 9,007,756 B2
(45) Date of Patent: Apr. 14, 2015

(54) DISPLAY DEVICE

(71) Applicant: Shenzhen China Star Optoelectronics Technology Co., Ltd., Shenzhen, Guangdong (CN)

(72) Inventors: Yi-cheng Kuo, Shenzhen (CN); Shih Hsiang Chen, Shenzhen (CN); Gang Yu, Shenzhen (CN); Gege Zhou, Shenzhen (CN); Jiaqiang Wang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 191 days.

(21) Appl. No.: 13/704,989

(22) PCT Filed: Dec. 4, 2012

(86) PCT No.: PCT/CN2012/085831
§ 371 (c)(1),
(2) Date: Dec. 18, 2012

(87) PCT Pub. No.: WO2014/082320
PCT Pub. Date: Jun. 5, 2014

(65) Prior Publication Data
US 2014/0146442 A1    May 29, 2014

(51) Int. Cl.
*H05K 5/00*    (2006.01)
*H05K 7/00*    (2006.01)
*G06F 1/16*    (2006.01)
*G02F 1/1333*    (2006.01)
*H05K 5/02*    (2006.01)

(52) U.S. Cl.
CPC ............... *G02F 1/1333* (2013.01); *H05K 5/02* (2013.01)

(58) Field of Classification Search
USPC ............... 361/679.21, 679.22, 679.26, 679.3, 361/679.55, 679.56; 349/56, 58, 60
See application file for complete search history.

(56) References Cited

U.S. PATENT DOCUMENTS

2011/0242448 A1* 10/2011 Oohira ............................. 349/60
2012/0169959 A1* 7/2012 Wei ................................. 349/58

* cited by examiner

*Primary Examiner* — Anthony Haughton
(74) *Attorney, Agent, or Firm* — Andrew C. Cheng

(57) ABSTRACT

A display device is proposed. The display device includes a frame, a back plate, a display panel, a flexible printed circuit board, and a tape. The frame is assembled to the back plate to form an accommodation space. The display panel, is disposed in the accommodation space and situated on top of the back plate. The flexible printed circuit board is stuck to and electrically connected to the display panel. The tape includes a first portion and a second portion. The first portion of the tape is disposed opposite the flexible printed circuit board on the display panel. The second portion of the tape is disposed between an edge of the display panel and a side wall of the frame. Therefore, light is prevented from being leaked from the display panel and the flexible printed circuit board is protected against being scratched in the present invention.

7 Claims, 10 Drawing Sheets

DISPLAY DEVICE

BACKGROUND OF THE INVENTION

1. Field of the Invention

The present invention relates to display technology, and more particularly, to a display device.

2. Description of the Prior Art

Please refer to FIG. 1 showing a schematic diagram of a conventional display device 10. The display device 10 comprises a frame 11, a housing 12, a back plate 13, a display panel 14, a source 15, and an optical film 16. The housing 12 assembled to the frame 11 and the back plate 13 performs the function of support. More specifically, the housing 12 supports the display panel 14 and sticks to the optical film 16 to avoid light leakage. However, the housing 12 is not easy to be assembled and fractures easily, which not only decreases production efficiency but also increases transportation difficulty.

To solve the above-mentioned problem, the housing 12 is not used conventionally. Instead, supporting components, replacing the housing 12, are disposed on four corners of the display device. The disposition of the supporting components simplifies processes of assembly and transportation, and cost is reduced as well. However, without the housing 12, light generated by the source 15 leaks easily from gaps between the display panel 14 and the optical film 16 when the display device 10 operates, which causes light leakage from the display panel 14. Further, without the housing 12, a flexible printed circuit board at the edge of the display panel 14 is inclined to get scratched by the supporting components or the frame 11.

SUMMARY OF THE INVENTION

An object of the present invention is to provide a display device in which light leakage from the display panel is avoided and a flexible printed circuit board is prevented from getting scratched.

According to the present invention, a display device comprises a frame, a back plate, a display panel, a flexible printed circuit board, and a tape. The back plate is assembled to the frame for forming an accommodation space. The display panel is disposed in the accommodation space and situated on top of the back plate. The flexible printed circuit board is stuck to and electrically connected to the display panel. The tape comprises a first portion and a second portion. The first portion of the tape is disposed opposite the flexible printed circuit board on the display panel. The second portion of the tape is disposed between an edge of the display panel and a side wall of the frame. The tape comprises a first tape and a second tape. The display panel comprises a first surface and a second surface which is disposed opposite the first surface of the display panel. A first portion of the flexible printed circuit board is disposed on the first surface of the display panel. A first portion of the first tape is disposed on the first portion of the flexible printed circuit board. A second portion of the first tape is bended downwards at an edge of the display panel. A first portion of the second tape is disposed on the second surface of the display panel, and a second portion of the second tape is bended downwards at the edge of the display panel. Glue is spread on the first portion of the tape beforehand.

According to the present invention, a display device, comprises a frame, a back plate, a display panel, a flexible printed circuit board, and a tape. The back plate is assembled to the frame for forming form an accommodation space. The display panel is disposed in the accommodation space and situated on top of the back plate. The flexible printed circuit board is stuck to and electrically connected to the display panel. The tape comprises a first portion and a second portion. The first portion of the tape is disposed opposite the flexible printed circuit board on the display panel, and the second portion of the tape is disposed between an edge of the display panel and a side wall of the frame.

In another aspect of the present invention, the display panel comprises a first surface and a second surface which is disposed opposite the first surface of the display panel. A first portion of the flexible printed circuit board is disposed on the first surface of the display panel. The first portion of the tape is disposed on the second surface of the display panel, and the second portion of the tape extends to the side wall of the frame from the edge of the display panel.

In another aspect of the present invention, the display panel comprises a first surface and a second surface which is disposed opposite the first surface of the display panel. A first portion of the flexible printed circuit board is disposed on the first surface of the display panel. The first portion of the tape is disposed on the second surface of the display panel, and the second portion of the tape is bended downwards at the edge of the display panel.

In another aspect of the present invention, a first portion of the flexible printed circuit board is disposed on a first surface of the display panel. The first portion of the tape is disposed on a first portion of the flexible printed circuit board, and the second portion of the tape extends to the side wall of the frame from the edge of the display panel.

In another aspect of the present invention, a first portion of the flexible printed circuit board is disposed on a first surface of the display panel. The first portion of the tape is disposed on the first portion of the flexible printed circuit board, and the second portion of the tape is bended downwards at the edge of the display panel.

In another aspect of the present invention, the display panel comprises a first surface and a second surface which is disposed opposite the first surface of the display panel. The tape comprises a first tape and a second tape. A first portion of the flexible printed circuit board is disposed on the first surface of the display panel. A first portion of the first tape is disposed on the first portion of the flexible printed circuit board, and a second portion of the first tape extends to the side wall of the frame from the edge of the display panel. A first portion of the second tape is disposed on the second surface of the display panel, and a second portion of the second tape extends to the side wall of the frame from the edge of the display panel.

In another aspect of the present invention, the tape comprises a first tape and a second tape, and the display panel comprises a first surface and a second surface which is disposed opposite the first surface of the display panel. A first portion of the flexible printed circuit board is disposed on the first surface of the display panel. A first portion of the first tape is disposed on the first portion of the flexible printed circuit board, and a second portion of the first tape is bended downwards at the edge of the display panel. A first portion of the second tape is disposed on the second surface of the display panel, and a second portion of the second tape is bended downwards at the edge of the display panel.

In another aspect of the present invention, the tape comprises a first tape and a second tape, and the display panel comprises a first surface and a second surface which is disposed opposite the first surface of the display panel. A first portion of the flexible printed circuit board is disposed on the first surface of the display panel. A first portion of the first tape is disposed on the first portion of the flexible printed circuit board, and a second portion of the first tape is bonded downwards at the edge of the display panel. A first portion of the second tape is disposed on the second surface of the display panel, and a second portion of the second tape extends to the side wall of the frame from the edge of the display panel.

In another aspect of the present invention, the tape comprises a first tape and a second tape. The display panel comprises a first surface and a second surface which is disposed opposite the first surface of the display panel. A first portion of the flexible printed circuit board is disposed on the first surface of the display panel. A first portion of the first tape is disposed on the first portion of the flexible primed circuit board, and a second portion of the first tape extends to the side wall of the frame from the edge of the display panel. A first portion of the second tape is disposed on the second surface of the display panel, and a second portion of the second tape is bended downwards at the edge of the display panel.

In another aspect of the present invention, glue is spread on the first portion of the tape beforehand.

In still another aspect of the present invention, the tape is a stripe-shaped tape.

In yet another aspect of the present invention, the tape is a planar tape. The display panel comprises a display area and a non-display area. The tape corresponding to the display area of the display panel is voided. The first portion of the tape is disposed on the non-display area of the display panel, and the second portion of the tape extends to the site wall of the frame from the edge of the display panel or is bended downwards at the edge of the display panel.

In contrast to the conventional technology, the present invention has advantages of avoiding light from being leaked from the display panel and preventing the flexible printed circuit board from being scratched. In the present invention, a tape which comprises a first portion and a second portion is disposed. The first portion is disposed opposite the flexible printed circuit board on the display panel, and the second portion is disposed between an edge of the display panel and a side wall of the frame. Owing to the disposition of the first portion, light leakage from the display panel is avoided. Owing to the disposition of the second portion, the flexible printed circuit board is prevented from getting scratched.

DETAILED DESCRIPTION OF THE PREFERRED EMBODIMENTS

Figure 1:
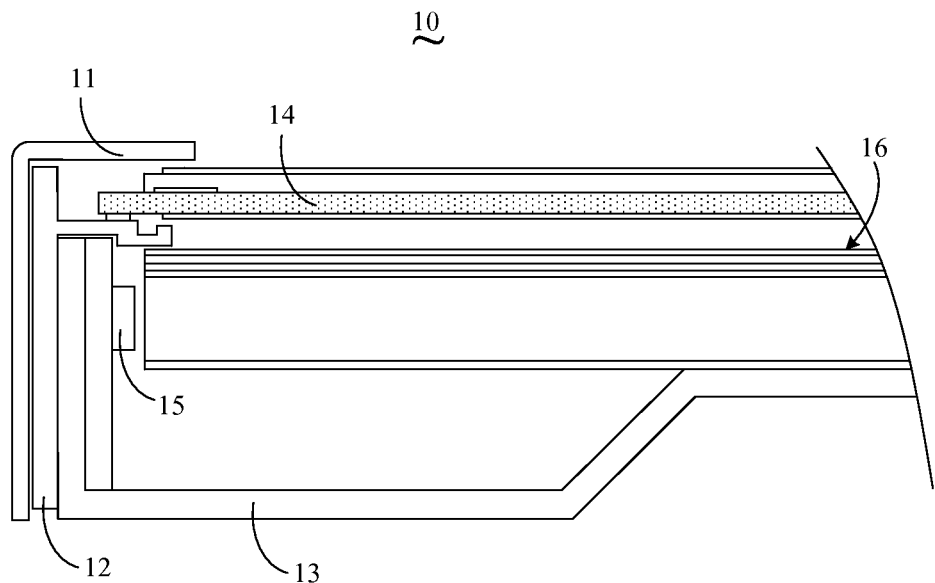
FIG. 1 shows a schematic diagram of a conventional display device.
Figure 2:
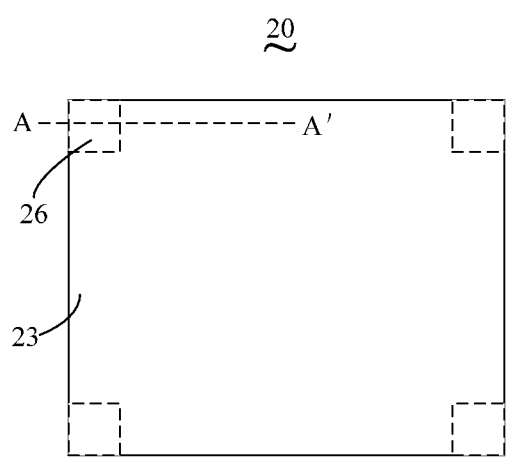
FIG. 2 shows a schematic diagram of the structure of a display device according to a first embodiment of the present invention.
Figure 3:
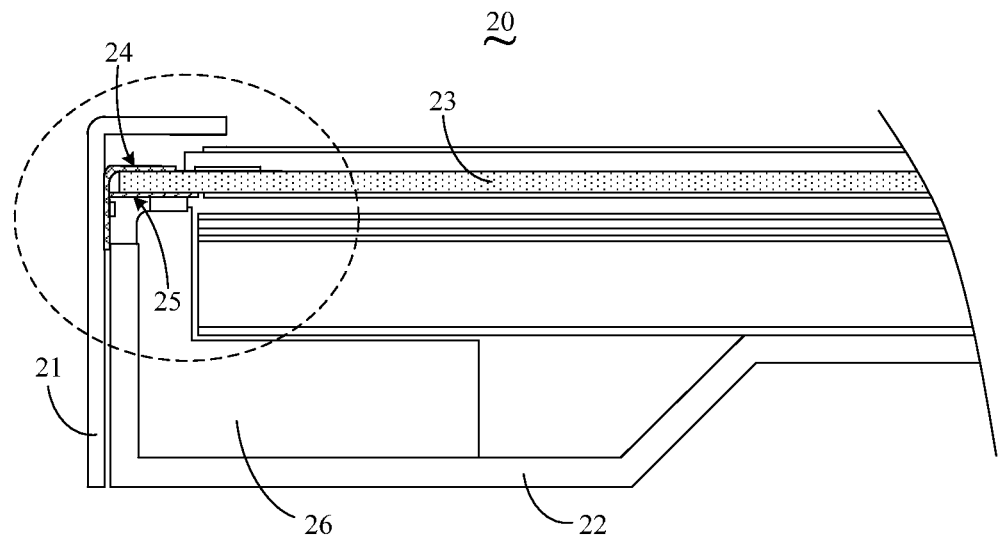
FIG. 3 shows a cross-section of the display device as shown in FIG. 2 along the dotted line AA'.

Please refer to FIG. 2 and FIG. 3. FIG. 2 shows a schematic diagram of the structure of a display device 20 according to a first embodiment of the present invention. FIG. 3 shows a cross-section of the display device 20 as shown in FIG. 2 along the dotted line AA'. The display device 20 comprises a frame 21, a back plate, a display panel 23, a flexible printed circuit board 24, and a tape 25, as shown in FIGS. 2 and 3.

Figure 4:
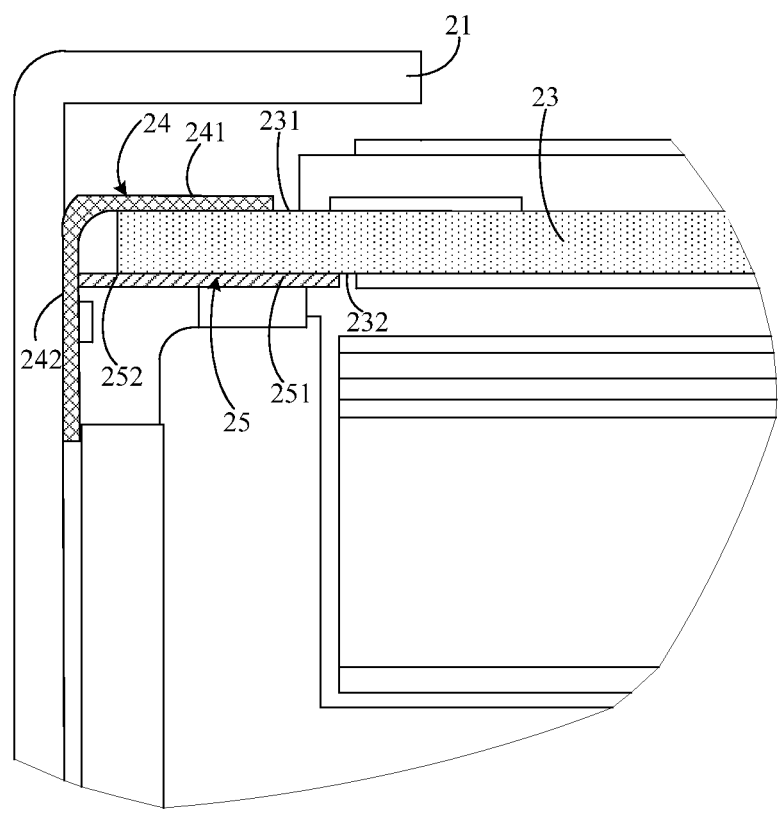
FIG. 4 is a partial, enlarged diagram of the display device as shown in FIG. 3.

The back plate 22 is assembled to the frame 21 to form an accommodation space. The display panel 23 is disposed in the accommodation space and situated on top of the back plate 22. The display device 20 does not comprise any housing in this embodiment for facilitating assembly and transportation. A support component 26 is disposed on each of the four corners of the display device 20 and supports the display panel 23. The flexible printed circuit board 24 is used for bearing driving components. The flexible printed circuit board 24 is stuck to and electrically connected to the display panel 23. The tape 25 comprises two portions. The structure of the tape 25 is illustrated in FIG. 4. FIG. 4 is a partial enlarged diagram of the display device 20 as shown in FIG. 3. The tape 25 comprises a first portion 251 and a second portion 252 as shown in FIG. 4. The first portion 251 is disposed opposite the flexible printed circuit board 24 on the display panel 23. The second portion 252 is disposed between an edge of the display panel 23 and a side wall of the frame 21.

Specifically, the display panel 23 comprises a first surface 231 and a second surface 232. The first surface 231 and the second surface 232 are disposed face to face. The flexible printed circuit board 24 comprises a first portion 241 and a second portion 242. The first portion 241 is disposed on the first surface 231. The second portion 242 is bended downwards at the edge of the display panel 25. The first portion 251 is disposed on the second surface 232 correspondingly. The second portion 252 extends to the side wall of the frame 21 from the edge of the display panel 23. So the terminal of the second portion 252 is completely stuck to the second portion 242, and the accommodation space is sealed. Because the accommodation space is sealed, light leakage is avoided. Further, the tape 25 is disposed on the second surface 232, which also prevents light from being leaked from the non-display area of the display panel 23.

Glue is spread on the first portion 251 of the tape 25 beforehand so that the tape 25 can be attached to the display panel 23.

In addition, the first portion 241 of the flexible printed circuit board 24 can be disposed on the second surface 232 of the display panel 23 in this embodiment. The first portion 251 is correspondingly disposed on the first surface 231 of the display panel 23. As for the disposition of the flexible printed circuit board 24 and the tape 25, there are no limits presented in this embodiment.

Figure 5:
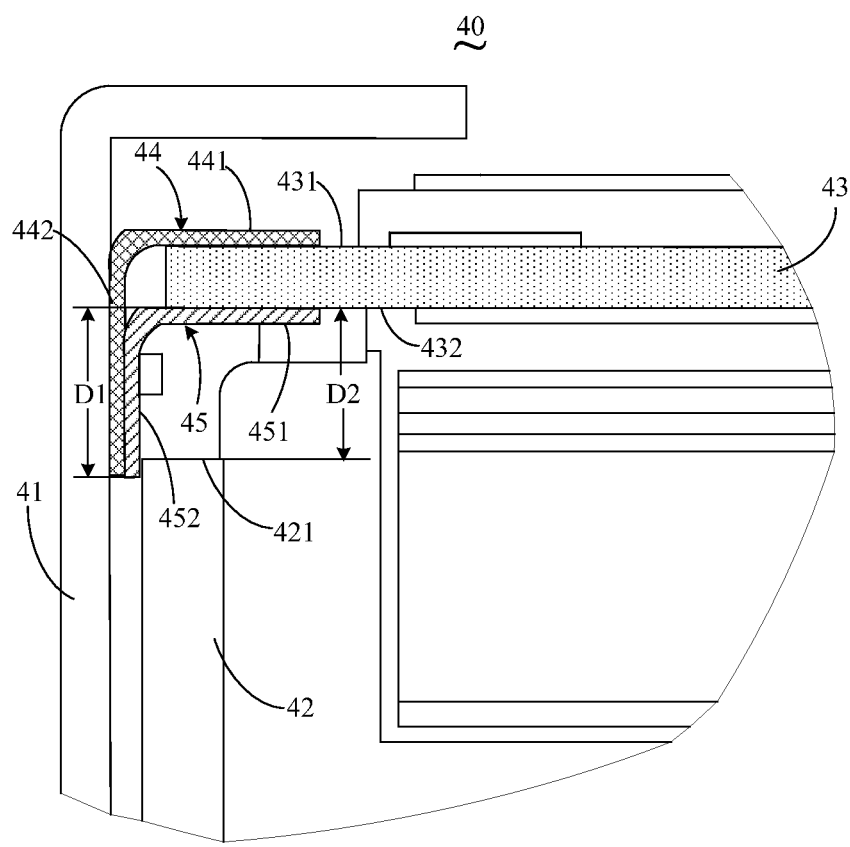
FIG. 5 shows a schematic diagram of the structure of a display device according to a second embodiment of the present invention.

Please refer to FIG. 5 showing a schematic diagram of the structure of a display device 40 according to a second embodiment of the present invention. The display device 40 comprises a frame 41, a back plate 42, a display panel 43, a flexible printed circuit board 44, and a tape 45. The flexible printed circuit board 44 comprises a first portion 441 and a second portion 442. The display panel 43 comprises a first surface 431 and a second surface 432. The first portion 441 is disposed on the first surface 431. The second portion 442 is bended downwards at an edge of the display panel 43. The tape 45 comprises a first portion 451 which is disposed on the second surface 432. In this way, light leakage from the non-display area of the display panel 43 is avoided.

The display device 40 and the display device 20 proposed in the first embodiment have differences. In the display device 40, the second portion 452 of the tape 45 is bended downwards at the edge of the display panel 43 and situated between the second portion 442 of the flexible printed circuit board 44 and the back plate 42.

The second portion 452 of the tape 45 is longer than the second portion 252 of the tape 25 in the first embodiment. The length D1 of the second portion 452 which is bended downwards is larger than or equal to the distance D2 between the second surface 432 and a terminal 421 of the back plate 42. Thus, the second portion 452 separates the back plate 42 from the flexible printed circuit board 44, which protects flexible printed circuit board 44 against getting scratched by the diamond-shaped terminal 421.

Therefore, light is prevented from being leaked from the non-display area of the display panel 43. Also, the flexible printed circuit board 44 is protected against getting scratched by the back plate 42 in this embodiment.

Figure 6:
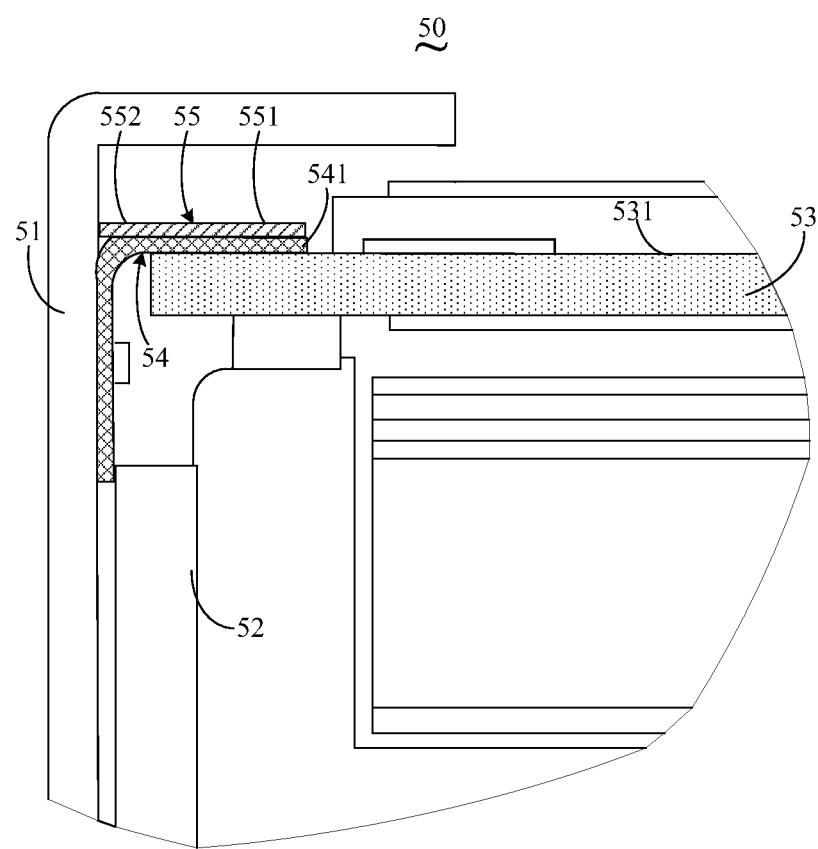
FIG. 6 shows a schematic diagram of the structure of a display device according to a third embodiment of the present invention.

Please refer to FIG. 6 showing a schematic diagram of the structure of a display device 50 according to a third embodiment of the present invention. The display device 50 comprises a frame 51, a back plate 52, a display panel 53, a flexible printed circuit board 54, and a tape 55. The flexible printed circuit board 54 comprises a first portion 541 which is disposed on a first surface 531 of the display panel 53.

The display device 50 and the display device 20 proposed in the first embodiment have differences. A first portion 551 of the tape 55 is disposed on the first portion 541. A second portion 552 of the tape 55 extends to a side wall of the frame 51 from an edge of the display panel 53. So the terminal of the second portion 552 is completely stuck to the side wall of the frame 51. In this way, the accommodation space is sealed, which avoids light leakage.

Likewise, the first portion 551 is disposed on the first portion 541, which also prevents light from being leaked from the non-display area of the display panel 53.

Figure 7:
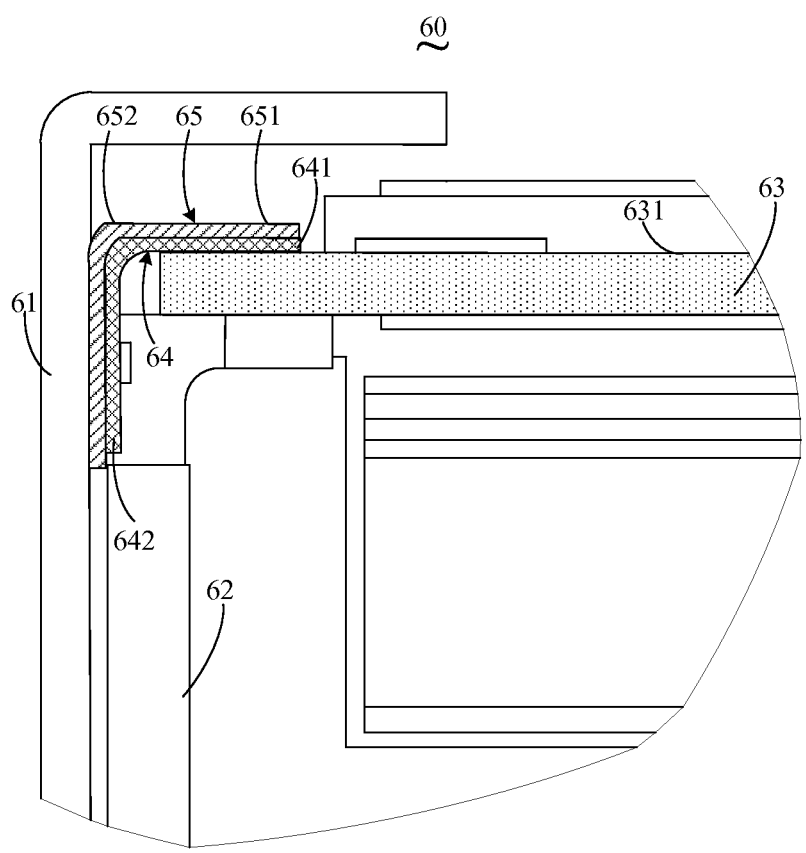
FIG. 7 shows a schematic diagram of the structure of a display device according to a fourth embodiment of the present invention.

Please refer to FIG. 7 showing a schematic diagram of the structure of a display device 60 according to a fourth embodiment of the present invention. The display device 60 comprises a frame 61, a back plate 62, a display panel 63, a flexible printed circuit board 64, and a tape 65. The flexible printed circuit board 64 comprises a first portion 641 and a second portion 642. The first portion 641 is disposed on a first surface 631 of the display panel 63. The second portion 642 is bended downwards at an edge of the display panel 63.

The display device 60 in this embodiment and the display device 40 proposed in the second embodiment have differences. In the display device 60, a first portion 651 of the tape 65 is disposed on the first portion 641, and a second portion 652 of the tape 65 is bended downwards along the frame 61 from the edge of the display panel 63 and situated between the frame 61 and the second portion 642. The design of the display device 60 prevents the frame 61 front scratching the flexible printed circuit board 64.

Therefore, it is impossible that light is leaked from the non-display area of the display panel 63 and that the flexible printed circuit board 64 is scratched by the frame 61.

Figure 8:
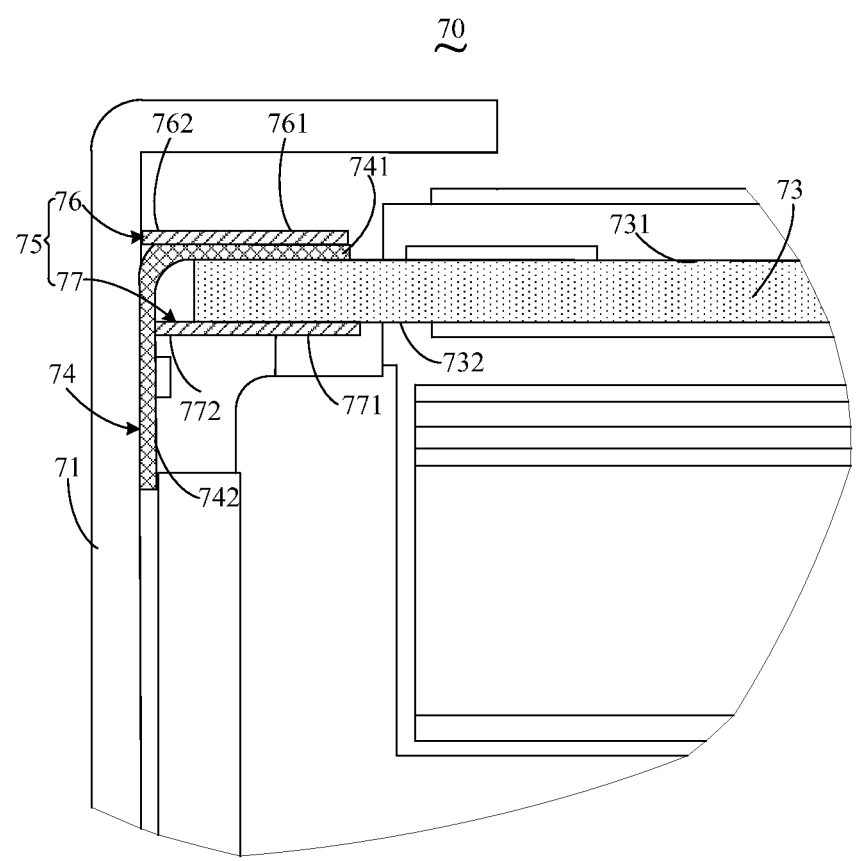
FIG. 8 shows a schematic diagram of the structure of a display device according to a fifth embodiment of the present invention.

Please refer to FIG. 8 showing a schematic diagram of the structure of a display device 70 according to a fifth embodiment of the present invention. The display device 70 comprises a frame 71, a display panel 73, a flexible printed circuit board 74, and a tape 75. The flexible printed circuit board 74 comprises a first portion 741 and a second portion 742. The first portion 741 is disposed on a first surface 731 of the display panel 73. The second portion 742 is bended downwards at an edge of the display panel 73.

The display device 70 and the display device 20 proposed in the first embodiment have differences. The tape 75 comprises a first tape 76 and a second tape 77. The first tape 76 comprises a first portion 761 and a second portion 762. The second tape 77 comprises a first portion 771 and a second portion 772. The first portion 761 is disposed on the first portion 741. The second portion 762 extends to a side wall of the frame 71 from the edge of the display panel 73. The first portion 771 is disposed on a second surface 732 of the display panel 73. The second portion 772 extends to the side wall of the frame 71 from the edge of the display panel 73. Thus, the second portion 762 can be completely stuck to the side wall of the frame 71, and the second portion 772 can be completely stuck to the second portion 742.

Compared with the display device 20 proposed in the first embodiment, light can be more successfully prevented from being leaked from the non-display area of the display panel 73 in the display device 70. This is because of the disposition of the first tape 76 and the second tape 77 in the display device 70.

Figure 9:
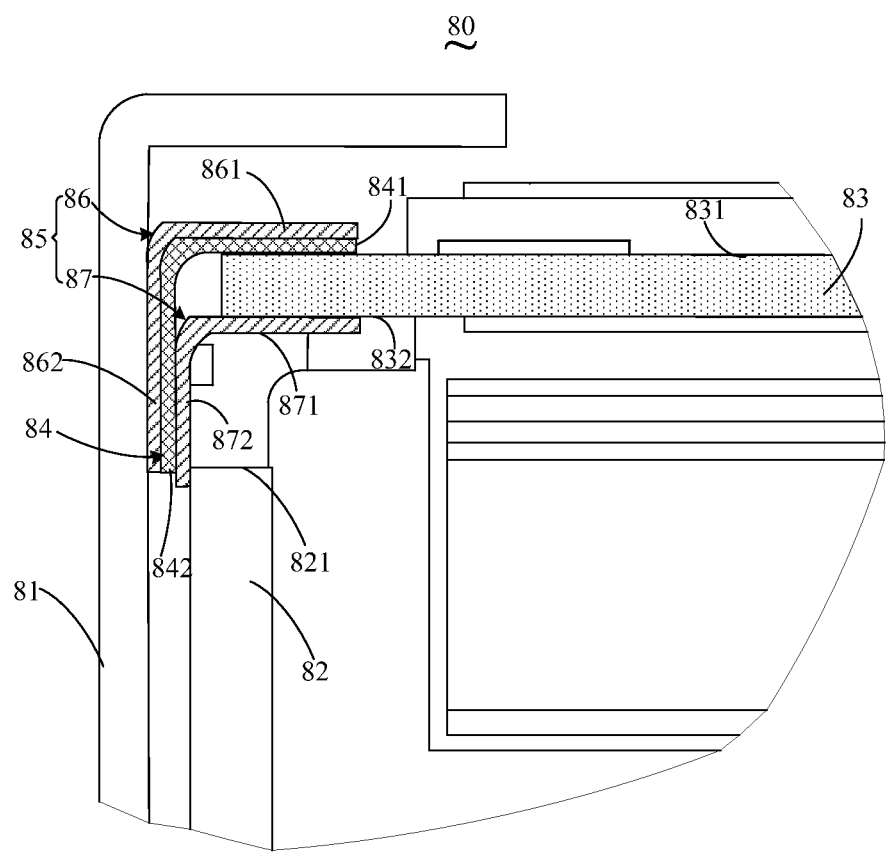
FIG. 9 shows a schematic diagram of the structure of a display device according to a sixth embodiment of the present invention.

Please refer to FIG. 9 showing a schematic diagram of the structure of a display device 80 according to a sixth embodiment of the present invention. The display device 80 comprises a frame 81, a back plate 82, a display panel 83, a flexible printed circuit board 84, and a tape 85. The flexible printed circuit board 84 comprises a first portion 841 and a second portion 842. The first portion 841 is disposed on a first surface 831 of the display panel 83. The second portion 842 is bended downwards at an edge of the display panel 83.

The display device 80 and the display device 70 proposed in the fifth embodiment have differences. In the display device 80, a first portion 861 of the first tape 86 is disposed on the first portion 841 of the flexible printed circuit board 84, and a second portion 862 of the first tape 86 is bended downwards at the edge of the display panel 83 and situated between the frame 81 and the second portion 842 of the flexible printed circuit board 84. The design of the display device 80 prevents the frame 81 from scratching the flexible printed circuit board 84. A first portion 871 of the second tape 87 is disposed on a second surface 832 of the display panel 83, and the second portion 872 of the second tape 87 is bolded downwards at the edge of the display panel 83 and situated between the second portion 842 and the back plate 82.

Likewise, the length of the second portion 872 of the second tape 87 is the same as the length of the second portion 452 of the tape 45 in the second embodiment. The design of this embodiment prevents a diamond-shaped terminal 821 of the back plate 82 from scratching the flexible printed circuit board 84.

Compared with the display device 70 proposed in the fifth embodiment, the display device 80 is better at avoiding light leakage from the non-display area of the display panel 83, preventing the frame 81 from scratching the flexible printed circuit board 84, and preventing the diamond-shaped terminal 821 of the hack plate 82 from scratching the flexible printed circuit board 84. This is because of the disposition of the first tape 86 and the second tape 87 in the display device 80.

In another preferred embodiment, the disposition of the first tape 86 and the disposition of the first tape 76 in the fifth embodiment may be the same. Or, the disposition of the second tape 87 may be the same as the disposition of the second tape 77 in the fifth embodiment. The disposition of the tape 85 will not be limited concretely here.

As mentioned above, the tape disposed on the display panel can prevent light from being leaked from the non-display area of the display panel, and further, protect the flexible printed circuit board against getting scratched by the frame and/or the back plate. The structures of the tape described in the first to sixth embodiments are illustrated in FIGS. 10 to 12.

Figure 10:
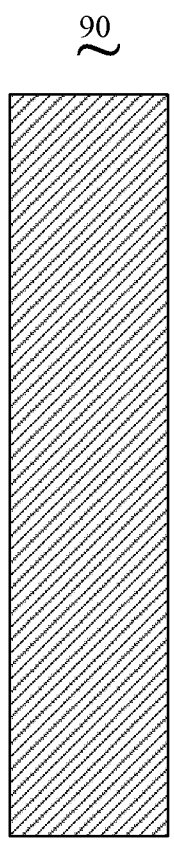
FIG. 10 shows a tape of the display device according to a seventh embodiment of the present invention.

As shown in FIG. 10, the tape 90 is a stripe-shaped tape in this embodiment. The tape 90 can be utilized in the display device in each of the above-mentioned embodiments.

In addition, a planar tape can be used. The tape 100 corresponding to the display area 101 of the display panel is voided, as shown in FIG. 11. A first portion 102 of the tape 100 is disposed on the non-display area of the display panel, and a second portion 103 of the tape 100 extends to a side wall of the frame from an edge of the display panel. The tape 100 can be utilized in the display devices proposed in the first, third, and fifth embodiments.

Figure 11:
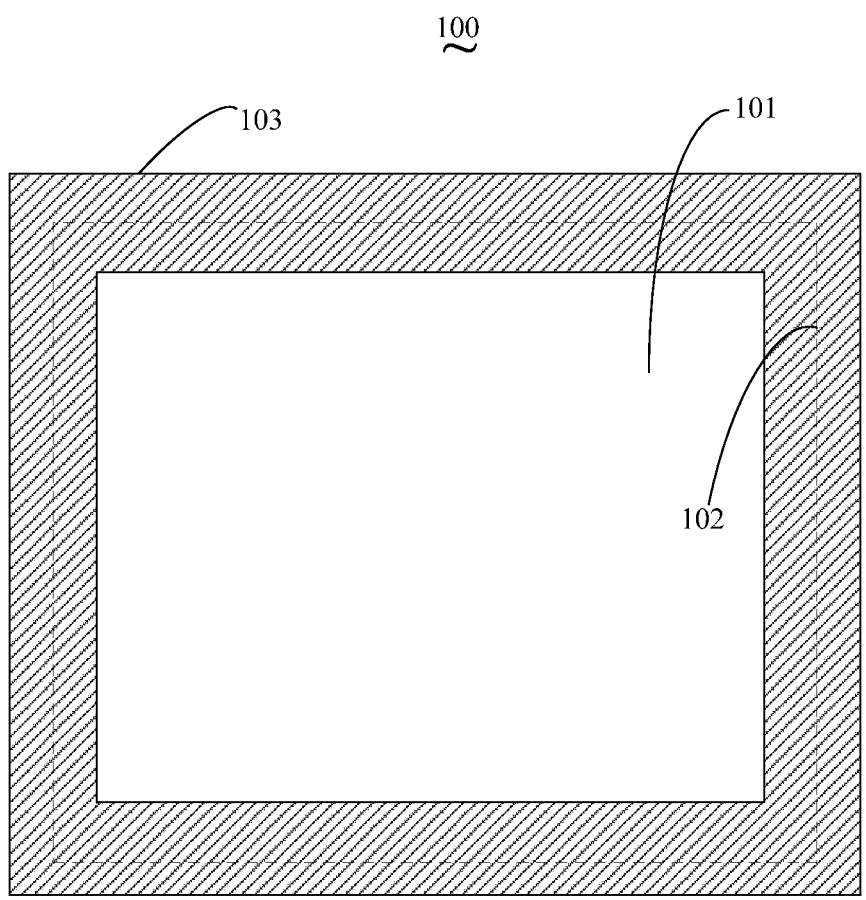
FIG. 11 shows a tape of the display device according to an eighth embodiment of the present invention.
Figure 12:
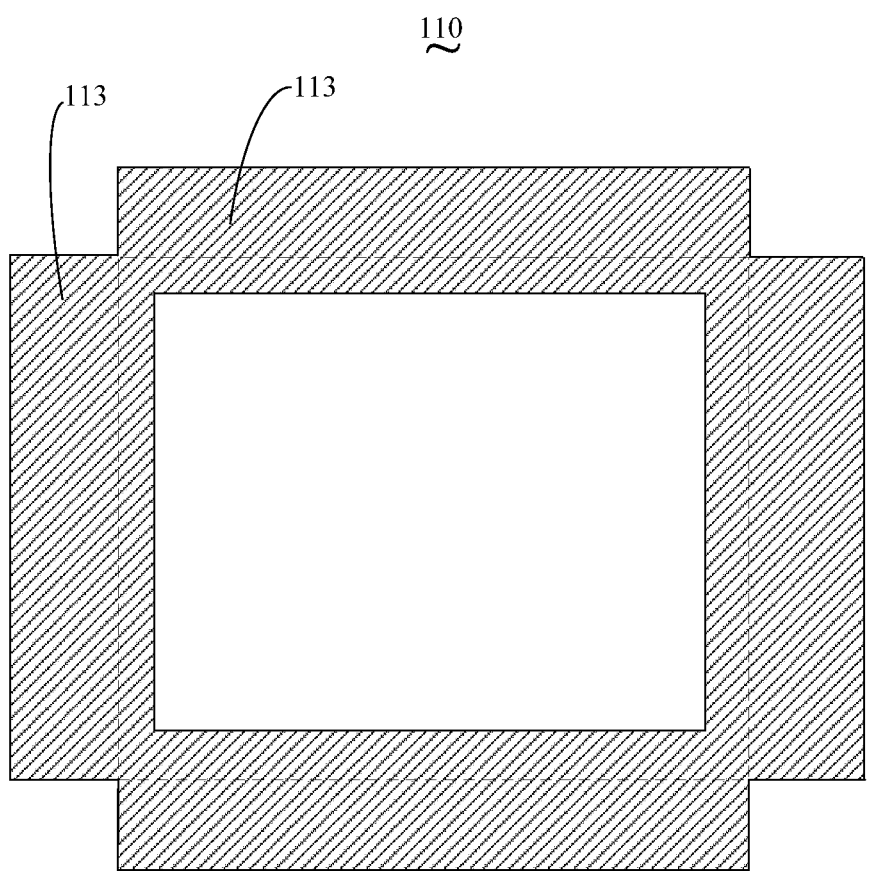
FIG. 12 shows a tape of the display device according to a ninth embodiment of the present invention.

Even though the tape 100 is planar as shown in FIG. 11, the structure of the tape 100 may be different in different embodiments. Please refer to FIG. 12 showing a tape 110. Both of the tape 110 and the tape 100 are planar. But unlike the tape 100, the tape 110 comprises separated second portions 113. Specifically, the second portions 113 of the tape 110 at any adjacent margins are separate so that the second portion 113 can be bended downwards and protect the flexible printed circuit board.

The tape 110 can be utilized in the display devices proposed in the second, fourth, and sixth embodiments.

To sum up, the display device of the present invention comprises a tape. The tape comprises the first portion and the second portion. The first portion is disposed on the display panel. The second portion extends to the side wall of the frame from the edge of the display panel or is bended downwards at the edge of the display panel. Therefore, light cannot be leaked from the display panel, and further, the flexible printed circuit board is protected owing to the design of the tape. In the present invention the tape is bended downwards at the edge of the display panel.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A display device, comprising:
   a frame;
   a back plate, assembled to the frame for forming an accommodation space;
   a display panel, disposed in the accommodation space and situated on top of the back plate, the display panel comprising a first surface and a second surface which is disposed opposite the first surface of the display panel;
   a flexible printed circuit board, stuck to and electrically connected to the display panel;
   a first tape, a first portion of the first tape being disposed on the first portion of the flexible printed circuit board, and a second portion of the first tape being bended downwards at an edge of the display panel;
   a second tape, comprising a first portion and a second portion, the first portion of the second tape disposed opposite the flexible printed circuit board on the second surface of the display panel, and the second portion of the second tape disposed between an edge of the display panel and a side wall of the frame and bended downwards at the edge of the display panel;
   wherein
   a first portion of the flexible printed circuit board is disposed on the first surface of the display panel; and
   glue is spread on the first portion of the tape beforehand.

2. A display device, comprising:
   a frame;
   a back plate, assembled to the frame for forming form an accommodation space;
   a display panel, disposed in the accommodation space and situated on top of the back plate, the display panel comprising a first surface and a second surface which is disposed opposite the first surface of the display panel;
   a flexible printed circuit board, stuck to and electrically connected to the display panel; and
   a tape, comprising a first portion and a second portion, the first portion of the tape disposed opposite the flexible printed circuit board on the display panel, and the second portion of the tape disposed between an edge of the display panel and a side wall of the frame, and
   wherein a first portion of the flexible printed circuit board is disposed on the first surface of the display panel, the first portion of the tape is disposed on the second surface of the display panel, and the second portion of the tape is bended downwards at the edge of the display panel.

3. The display device as claimed in claim 2, wherein the display panel comprises a first surface and a second surface which is disposed opposite the first surface of the display panel, a first portion of the flexible printed circuit board is disposed on the first surface of the display panel, the first portion of the tape is disposed on the second surface of the display panel, and the second portion of the tape is bended downwards at the edge of the display panel.

4. The display device as claimed in claim 2, wherein glue is spread on the first portion of the tape beforehand.

5. The display device as claimed in claim 2, wherein the tape is a stripe-shaped tape.

6. The display device as claimed in claim 2, wherein the tape is a planar tape, the display panel comprises a display area and a non-display area, the tape corresponding to the display area of the display panel is voided, the first portion of the tape is disposed on the non-display area of the display panel, and the second portion of the tape extends to the side wall of the frame from the edge of the display panel or is bended downwards at the edge of the display panel.

7. A display device, comprising:
   a frame;
   a back plate, assembled to the frame for forming form an accommodation space;
   a display panel, disposed in the accommodation space and situated on top of the back plate, the display panel comprising a first surface and a second surface which is disposed opposite the first surface of the display panel;
   a flexible printed circuit board, stuck to and electrically connected to the display panel, a first portion of the flexible printed circuit board being disposed on the first surface of the display panel;
   a first tape, a first portion of the first tape being disposed on the first portion of the flexible printed circuit board, and a second portion of the first tape being bended downwards at the edge of the display panel; and a second tape, a first portion of the second tape being disposed on the second surface of the display panel, and a second portion of the second tape extending to the side wall of the frame from the edge of the display panel.

* * * * *